(12) United States Patent
Huang

(10) Patent No.: US 10,796,928 B1
(45) Date of Patent: Oct. 6, 2020

(54) WIRING STRUCTURE AND METHOD FOR MANUFACTURING THE SAME

(71) Applicant: Advanced Semiconductor Engineering, Inc., Kaohsiung (TW)

(72) Inventor: Wen Hung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/455,548

(22) Filed: Jun. 27, 2019

(51) Int. Cl.
| | |
|---|---|
| H05K 1/02 | (2006.01) |
| H05K 1/09 | (2006.01) |
| H05K 1/11 | (2006.01) |
| H05K 3/00 | (2006.01) |
| H05K 3/40 | (2006.01) |
| H05K 3/46 | (2006.01) |
| H01L 21/00 | (2006.01) |
| H01L 21/48 | (2006.01) |
| H01L 23/498 | (2006.01) |
| H01L 33/00 | (2010.01) |
| H01L 33/02 | (2010.01) |
| H01L 33/22 | (2010.01) |
| H01L 33/38 | (2010.01) |
| H01L 33/46 | (2010.01) |
| H01L 33/50 | (2010.01) |
| H01L 33/62 | (2010.01) |

(52) U.S. Cl.
CPC ........ *H01L 21/4857* (2013.01); *H01L 21/481* (2013.01); *H01L 23/49822* (2013.01); *H01L 23/49833* (2013.01)

(58) Field of Classification Search
CPC ... H05K 1/02; H05K 1/09; H05K 1/11; H05K 3/00; H05K 3/11; H05K 3/40; H05K 3/46; H01L 21/00; H01L 21/48; H01L 23/498; H01L 33/00; H01L 33/02; H01L 33/22; H01L 33/38; H01L 33/46; H01L 33/50; H01L 33/62
USPC .................. 174/261, 257; 257/90, 700; 1/1
See application file for complete search history.

(56) References Cited

U.S. PATENT DOCUMENTS

| | | | | |
|---|---|---|---|---|
| 9,735,312 | B2 * | 8/2017 | Chiu | ............... H01L 33/0093 |
| 2016/0381794 | A1 * | 12/2016 | Ahn | ....................... H05K 1/165 |
| | | | | 174/257 |
| 2017/0306383 | A1 * | 10/2017 | Imai | ....................... C12Q 1/001 |
| 2018/0005931 | A1 * | 1/2018 | Chen | ..................... H01L 23/562 |
| 2019/0214373 | A1 * | 7/2019 | Kim | ......................... H01L 33/22 |
| 2019/0252585 | A1 * | 8/2019 | Hsieh | ..................... H01L 33/38 |

\* cited by examiner

*Primary Examiner* — Xiaoliang Chen
(74) *Attorney, Agent, or Firm* — Foley & Lardner LLP

(57) ABSTRACT

A wiring structure includes a first unit, a second unit, a first insulation wall, a first redistribution layer and a third unit. The first unit is disposed at a first elevation and having a first circuit layer and a first dielectric layer surrounding the first circuit layer. The second unit is disposed at the first elevation and having a second circuit layer and a second dielectric layer surrounding the second circuit layer. The first insulation wall is disposed between the first unit and the second unit. The first redistribution layer is disposed on the first unit and the second unit, and electrically connected between the first unit and the second unit. The third unit is disposed on the first redistribution layer and having a third circuit layer and a third dielectric layer surrounding the third circuit layer.

20 Claims, 18 Drawing Sheets

WIRING STRUCTURE AND METHOD FOR MANUFACTURING THE SAME

BACKGROUND

1. Field of the Disclosure

The present disclosure relates to wiring structures, and more particular to a disaggregation wiring structure and methods thereof manufacturing the same.

2. Description of the Related Art

As technology advances, semiconductor chips are integrated with a growing number of electronic components to enhance performance. Accordingly, the semiconductor chips are provided with relatively more input/output (I/O) connections.

A substrate, which is used to package or assemble the semiconductor chip(s), may have to be scaled up to carrying out the increasing number of I/O connections of the semiconductor chip(s). However, as the size of the packaging substrate grows up, warpage of a semiconductor chip (device) package could be relatively severe, which may adversely affect yield of the semiconductor device package(s).

SUMMARY

In some embodiments, the present disclosure relates to a wiring structure. The wiring structure includes a first unit, a second unit, a first insulation wall, a first redistribution layer, and a third unit. The first unit is disposed at a first elevation and has a first circuit layer and a first dielectric layer surrounding the first circuit layer. The second unit is disposed at the first elevation and has a second circuit layer and a second dielectric layer surrounding the second circuit layer. The first insulation wall is disposed between the first unit and the second unit. The first redistribution layer is disposed on the first unit and the second unit. The first redistribution layer is electrically connected between the first unit and the second unit. The third unit is disposed on the first redistribution layer and has a third circuit layer and a third dielectric layer surrounding the third circuit layer.

In some embodiments, the present disclosure relates to a method of manufacturing a wiring structure. The method includes providing a number of first units, encapsulating the number of first units to form a layer of first units, forming a first redistribution layer on the layer of first units; providing a number of second units, encapsulating the number of second units to form a layer of second units, and stacking the layer of second units onto the first redistribution layer.

In some embodiments, the present disclosure relates to a multi-layer substrate. The multi-layer includes a first layer, a first redistribution layer and a second layer. The first layer has a number of first units embedded in a first insulation material. The first redistribution layer is disposed on the first layer. The second layer has a number of second units embedded in a second insulation material, and is disposed on the first redistribution layer.

In some embodiments, the present disclosure relates to a wiring structure. The wiring structure includes a first sub-unit, a second sub-unit, a first insulation wall, and a third redistribution layer. The first sub-unit is disposed at a first elevation and has a first circuit layer, a first dielectric layer surrounding the first circuit layer, and a first redistribution layer disposed on the first circuit layer. The second sub-unit is disposed at the first elevation and has a second circuit layer, a second dielectric layer surrounding the second circuit layer, and a second redistribution layer disposed on the second circuit layer. The first insulation wall is disposed between the first sub-unit and the second sub-unit. The third redistribution layer is disposed on the first sub-unit and the second sub-unit, and electrically connected between the first sub-unit and the second sub-unit.

In some embodiments, the present disclosure relates to a method of manufacturing a wiring structure. The method includes providing a number of first sub-units, encapsulating the number of first sub-units to form a number of first units, and encapsulating the number of first units to form a layer of first units.

In some embodiments, the present disclosure relates to a substrate. The substrate includes a number of units embedded in a first insulation material, and at least one of the number of units comprising a number of sub-units embedded in a second insulation material.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
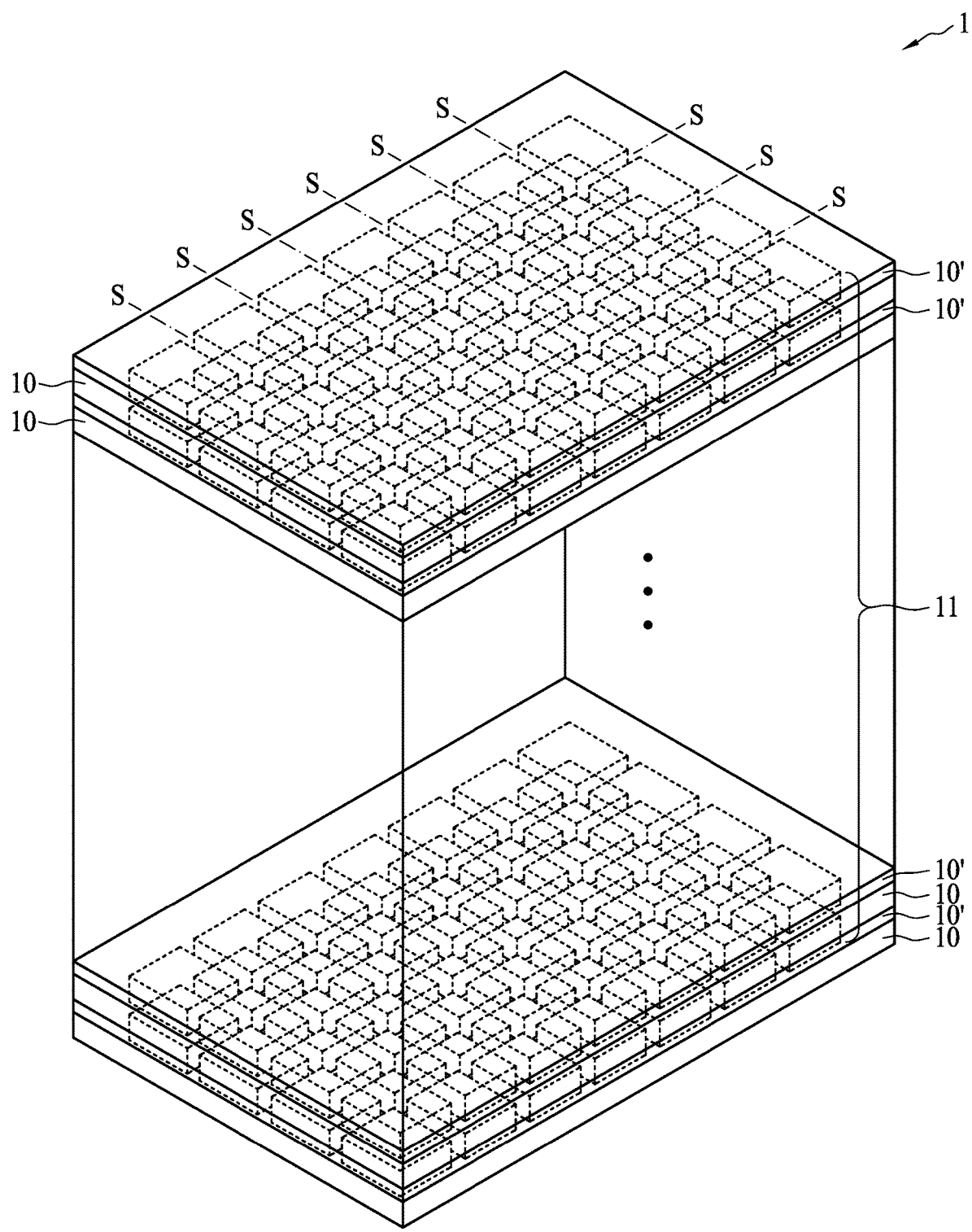
FIG. 1 illustrates a perspective view of a panel of wiring structures according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (μm)/10 μm, the number of the dielectric layers of such core substrate is relatively large. Although the manufacturing cost of such core substrate is relatively low, the manufacturing yield for the circuit layers and the dielectric layers of such core substrate is also relatively low, and, thus, the yield of such core substrate is relatively low.

At least some embodiments of the present disclosure provide for a wiring structure which has an advantageous compromise of yield and manufacturing cost. At least some embodiments of the present disclosure further provide for techniques for manufacturing the wiring structure.

FIG. 1 illustrates a perspective view of a panel of wiring structures 1 according to some embodiments of the present disclosure.

Referring to FIG. 1, the panel of wiring structures 1 may include layers 10 and redistribution layers 10'. The panel 1 can include a multi-layer structure. The panel 1 may include a stack structure of layers 10 and redistribution layers 10'. The panel 1 can include a number of wiring structures 11.

A wiring structure 11 can include a multi-layer structure. A wiring structure 11 can be separated from the panel 1 by using cutting technique along the cutting lines (or scribe lines) S. Although the wiring structures 11 are arranged or disposed in a rectangular or rectangle-like shape in FIG. 1, however, it is contemplated that the wiring structures 11 can be arranged in a shape other than the above.

Figure 2:
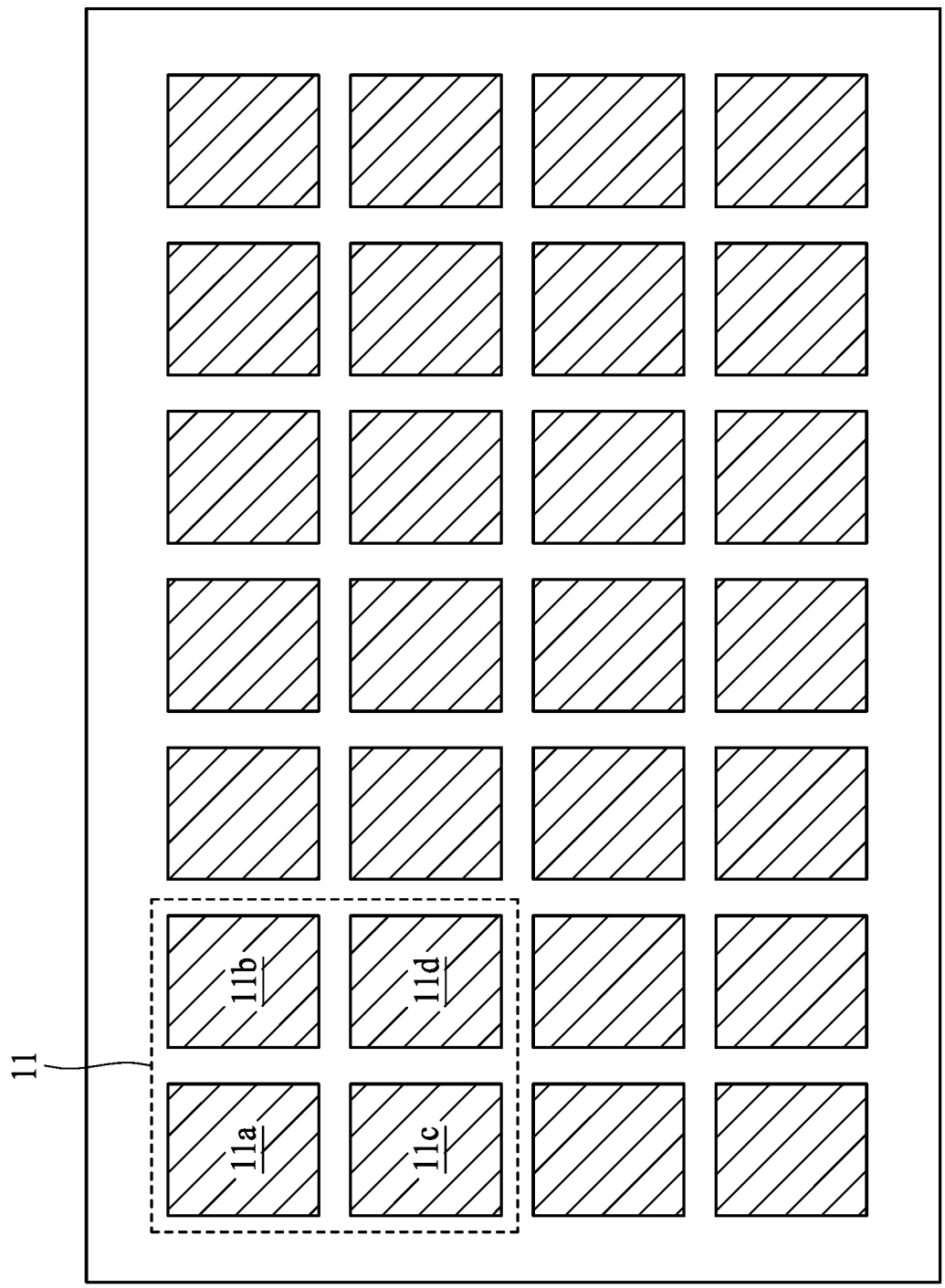
FIG. 2 illustrates a layout of the layer 10 of the panel 1 as shown in FIG. 1.

FIG. 2 illustrates a layout of the layer 10 of the panel 1 as shown in FIG. 1.

Referring to FIG. 2, the layer 10 may include unit 11a, unit 11b, unit 11c and unit 11d. The wiring structure 11, which can include a multi-layer structure, can include the unit 11a, unit 11b, unit 11c and unit 11d as shown in the dotted box. Although FIG. 2 illustrates a layer 10 of a wiring structure 11 that can have four units, however, it is contemplated that the layer 10 of the wiring structure 11 may include more or less unit(s).

Figure 3:
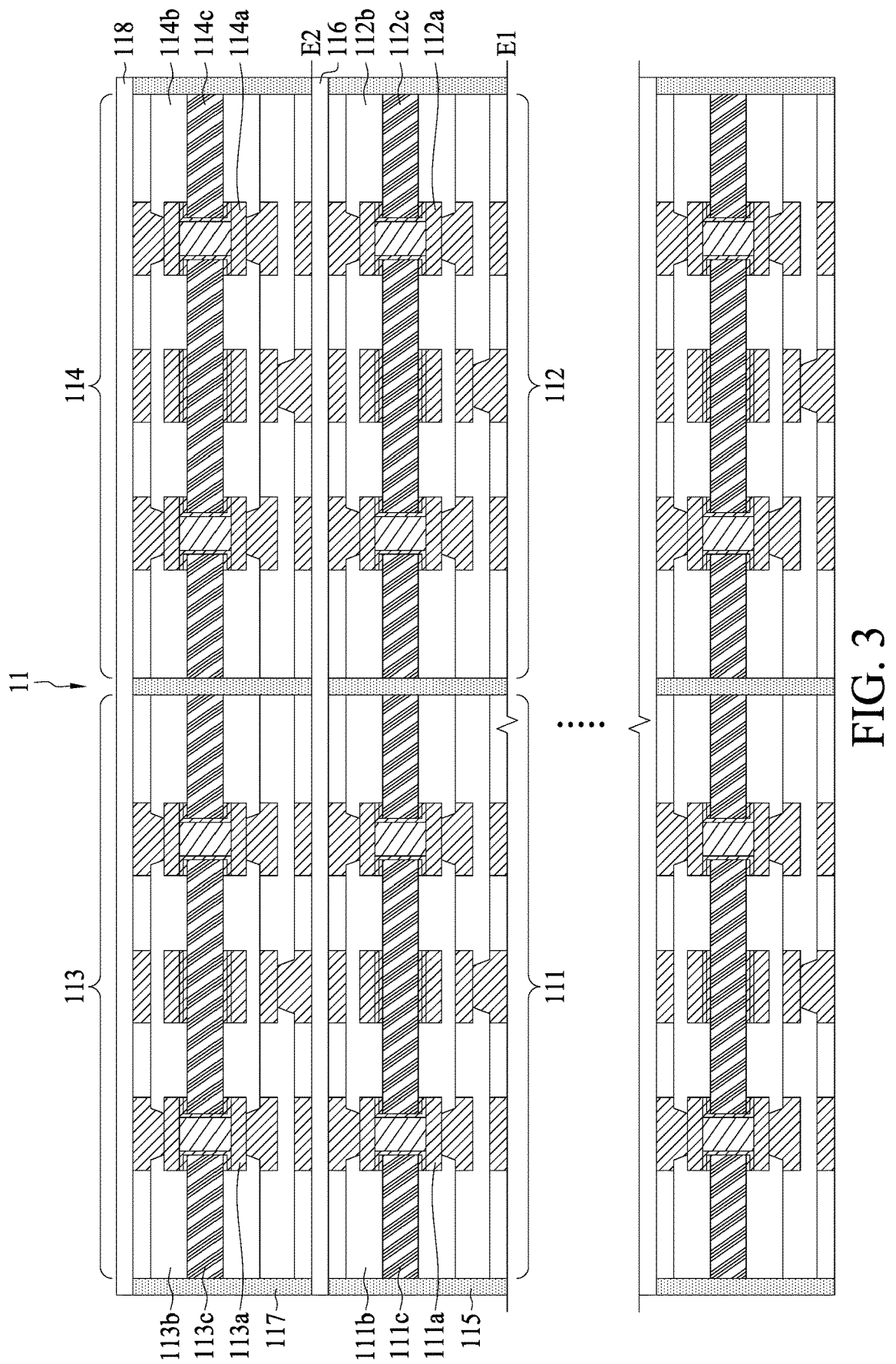
FIG. 3 illustrates a wiring structure according to some embodiments of the present disclosure.

FIG. 3 illustrates a wiring structure 11 according to some embodiments of the present disclosure.

Referring to FIG. 3, the wiring structure 11 may include unit 111, unit 112, unit 113, unit 114, and other units (not denoted in FIG. 3).

The unit 111 can be disposed at an elevation E1. The unit 111 may have a circuit layer 111a. The unit 111 may have a dielectric layer 111b. The dielectric layer 111b can surround the circuit layer 111a. The unit 111 can have a core 111c. The core 111c can be eliminated in some other embodiments of the present disclosure.

The unit 112 can be disposed at an elevation which is substantially the same to elevation E1. The unit 112 may have a circuit layer 112a. The unit 112 may have a dielectric layer 112b. The dielectric layer 112b can surround the circuit layer 112a. The unit 112 may have a core 112c. The core 112c can be eliminated in some other embodiments of the present disclosure.

The wiring structure 11 can have an insulation wall 115 disposed between units 111 and 112. The wiring structure 11 may have a redistribution layer 116 disposed on the units 111 and 112. The redistribution layer 116 can be electrically connected between the units 111 and 112. The insulation wall 115 may include materials substantially different from the dielectric layer 111b. The insulation wall 115 may include materials substantially the same to the dielectric layer 111b. The insulation wall 115 may include encapsulant(s) or encapsulation material. The insulation wall 115 may include particles. The insulation wall 115 may include resin and fillers (or particles). The insulation wall 115 may include molding compound. The insulation wall 115 may include thermoset material(s). The insulation wall 115 may include thermoplastic material(s).

The insulation wall 115 can surround the unit 111. The insulation wall 115 can enclose the unit 111. The insulation wall 115 may be in direct contact with the unit 111.

The insulation wall 115 can surround the unit 112. The insulation wall 115 can enclose the unit 112. The insulation wall 115 may be in direct contact with the unit 112.

The redistribution layer 116 can be disposed on the insulation wall 115. The redistribution layer 116 can be in direct contact with the insulation wall 115.

The unit 113 can be disposed on the redistribution layer 116. The unit 113 may have a circuit layer 113a. The unit 113 may have a dielectric layer 113b. The dielectric layer 113b can surround the circuit layer 113a. The unit 113 can have a core 113c. The redistribution layer 116 can be electrically connected to the unit 113. The core 113c can be eliminated in some other embodiments of the present disclosure.

The circuit layer 111a may have a pitch substantially same to the circuit layer 112a. The circuit layer 111a may have a wire length/space substantially same to the circuit layer 112a. The circuit layer 111a may have a pitch substantially same to the circuit layer 113a. The circuit layer 111a may have a wire length/space substantially same to the circuit layer 113a. The circuit layer 111a may have a pitch substantially same to the redistribution layer 116. The circuit layer 111a may have a wire length/space substantially same to the redistribution layer 116. The circuit layer 111a may have a pitch substantially different from the redistribution layer 116. The circuit layer 111a may have a wire length/space substantially different from the redistribution layer 116. The circuit layer 111a may have a pitch of approximately 10 μm. The circuit layer 111a may have a wire length/space approximately 10 μm/10 μm. The circuit layer 111a may have a wire length/space less than approximately 10 μm/10 μm.

The unit 114 can be disposed on the redistribution layer 116. The unit 114 can have a circuit layer 114a. The unit 114 can have a dielectric layer 114b. The dielectric layer 114b can surround the circuit layer 114a. The units 113 and 114 can be disposed at a substantially same elevation E2. The circuit layer 113a may have a pitch substantially same to the circuit layer 114a. The circuit layer 113a may have a wire length/space substantially same to the circuit layer 114a.

The wiring structure 11 may include an insulation wall 117 disposed between the units 113 and 114. The insulation wall 117 may include a material substantially same to the insulation wall 115. The insulation wall 117 may include a material substantially different from the insulation wall 115. The insulation wall 117 can surround the unit 113. The insulation wall 117 can enclose the unit 113. The insulation wall 117 may be in direct contact with the unit 113.

The insulation wall 117 can surround the unit 114. The insulation wall 117 can enclose the unit 114. The insulation wall 117 may be in direct contact with the unit 114.

The wiring structure 11 may include a redistribution layer 118 disposed on the unit 113 and the unit 114. The redistribution layer 118 can be electrically connected between the units 113 and 114. The redistribution layer 118 can be disposed on the insulation wall 117. The redistribution layer 118 can be in direct contact with the insulation wall 117.

The circuit layer 113a can have a pitch substantially same to the redistribution layer 118. The circuit layer 113a may have a wire length/space substantially same to the redistribution layer 118. The circuit layer 113a may have a pitch substantially different from the redistribution layer 118. The circuit layer 113a may have a wire length/space substantially different from the redistribution layer 118.

FIG. 3A, FIG. 3B, FIG. 3C, FIG. 3D and FIG. 3E illustrate a method of manufacturing a wiring structure according to some embodiments of the present disclosure.

Figure 3B:
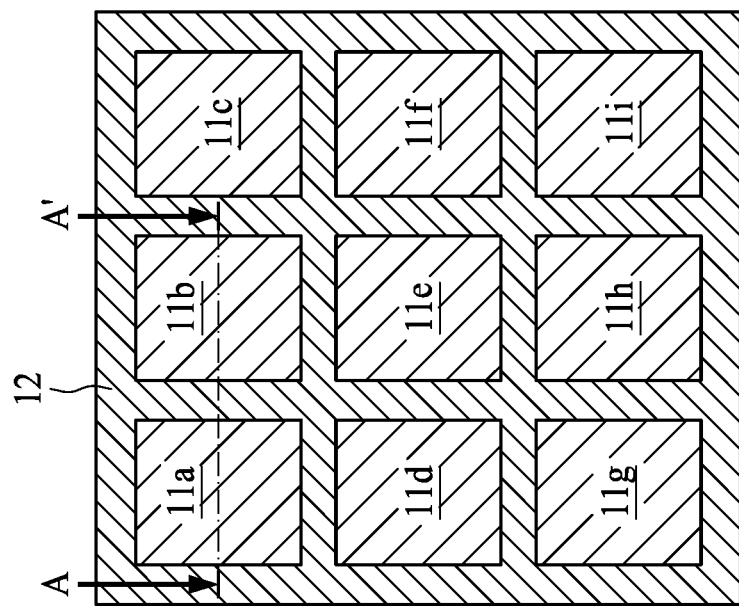
FIG. 3A, FIG. 3B, FIG. 3C, FIG. 3D and FIG. 3E illustrate a method of manufacturing a wiring structure according to some embodiments of the present disclosure.
Figure 3A:
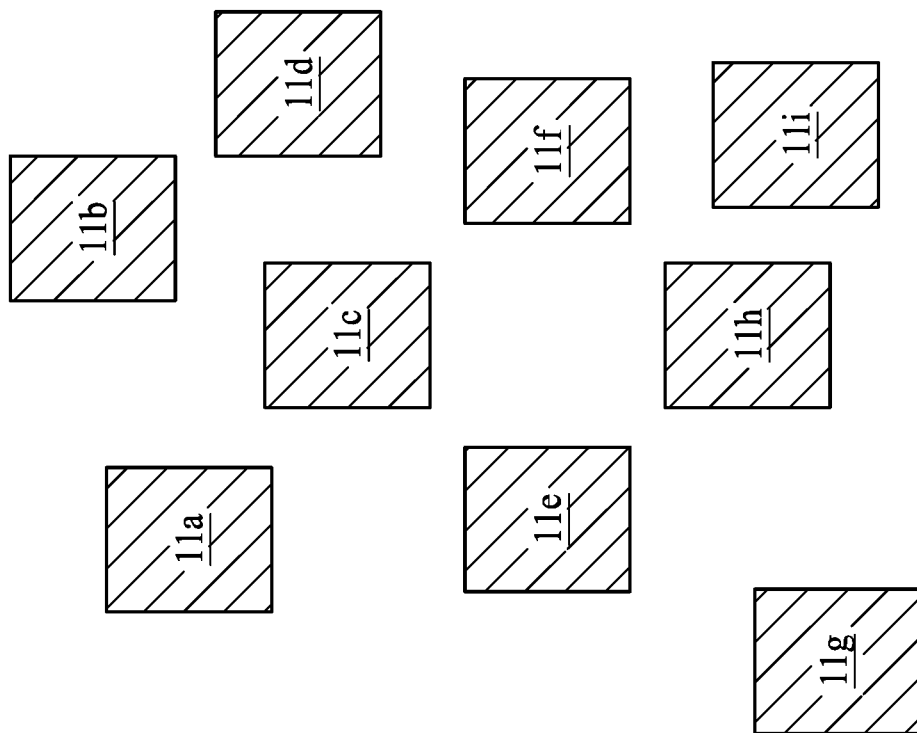

FIG. 3A illustrates some wiring structure units 11a, 11b, 11c, 11d, 11e, 11f, 11g, 11h and 11i, which may pass test(s) and may be called as good unit(s) or functional units.

FIG. 3B illustrates a layout of the units as shown in FIG. 3A.

Referring to FIG. 3B, the units 11a, 11b, 11c, 11d, 11e, 11f, 11g, 11h and 11i can be arranged, disposed or constructed in a pattern, for example but is not limited to a square, a square-like shape, a rectangle, a rectangle-like shape, a round shape or other shapes. One of the units 11a, 11b, 11c, 11d, 11e, 11f, 11g, 11h and 11i may be surrounded by an insulation wall 12 or insulation material 12. One of the units 11a, 11b, 11c, 11d, 11e, 11f, 11g, 11h and 11i may be enclosed by an insulation wall 12 or insulation material 12. An insulation wall 12 or encapsulation material 12 may encapsulate the units 11a, 11b, 11c, 11d, 11e, 11f, 11g, 11h and 11i. Encapsulation material 12 may be used to encapsulate the units 11a, 11b, 11c, 11d, 11e, 11f, 11g, 11h and 11i by, for example but is not limited to, molding technique. An insulation wall 12 or encapsulation material 12 may be in direct contact with a lateral surface (not denoted) of one of the units 11a, 11b, 11c, 11d, 11e, 11f, 11g, 11h and 11i.

Figure 3C:
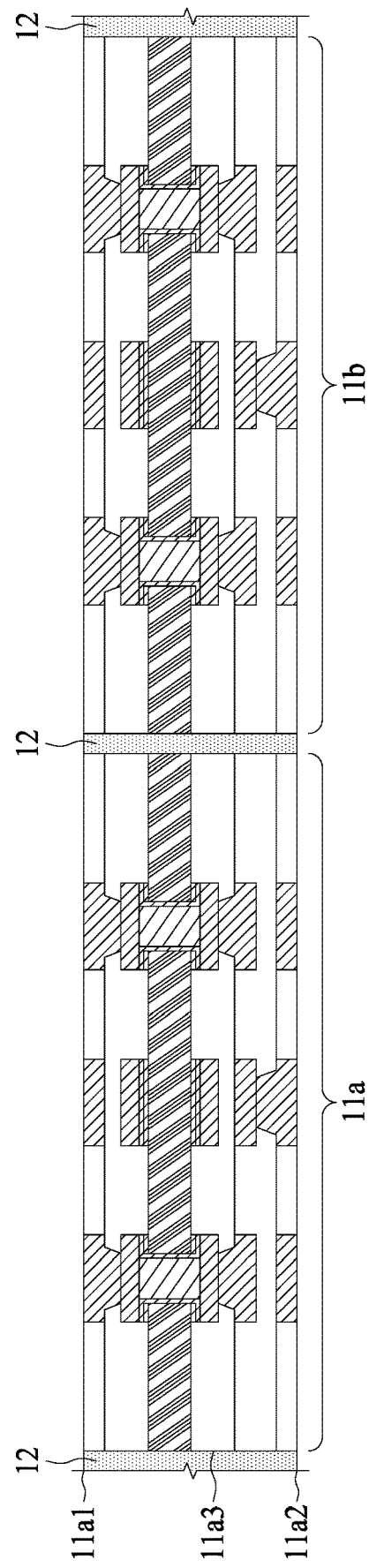

FIG. 3C illustrates a cross-sectional view of the structure across line AA' as shown in FIG. 3B.

Referring to FIG. 3C, units 11a and 11b can be disposed at a substantially same elevation. The units 11a and 11b can be separated by the insulation wall 12. The insulation wall 12 can surround the unit 11a. The insulation wall 12 can surround the unit 11b. The insulation wall 12 can enclose the unit 11a. The insulation wall 12 can enclose the unit 11b. The insulation wall 12 can be in direct contact with the unit 11a. The insulation wall 12 can be in direct contact with the unit 11b. The insulation wall 12 can be in direct contact with a lateral surface (not denoted) of the unit 11a. The insulation wall 12 can be in direct contact with a lateral surface (not denoted) of the unit 11b.

Each of the units 11a and 11b can have a surface 11a1, a surface 11a2 opposite the surface 11a1, and a surface 11a3 extended between the surface 11a1 and the surface 11a2. Encapsulating the units 11a and 11b can include encapsulating the surface 11a3 of each of the units 11a and 11b and exposing the surface 11a1 and the surface 11a2 of each of the units 11a and 11b.

Figure 3D:
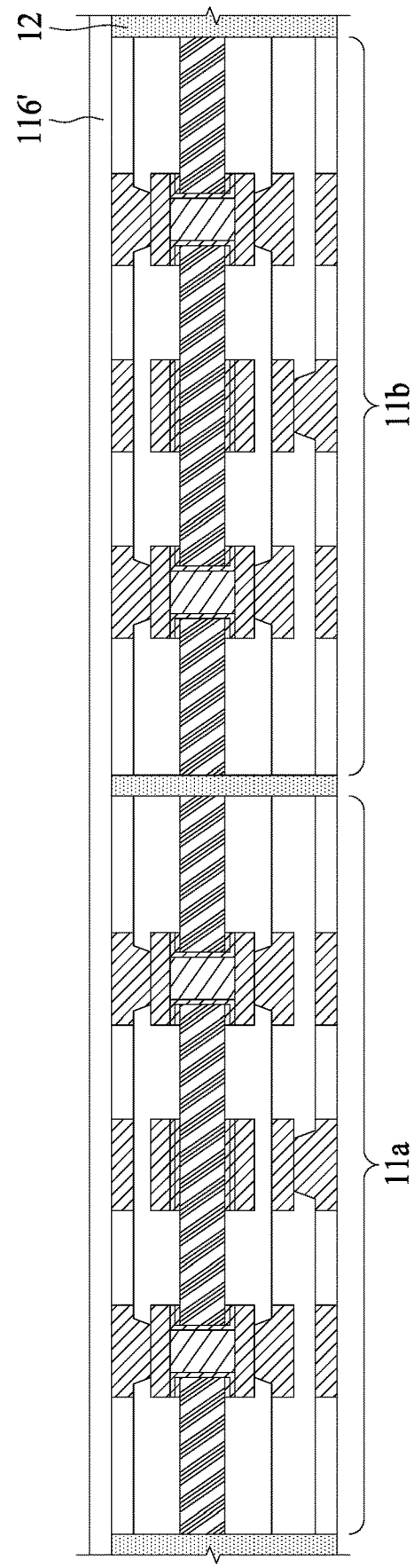

Referring to FIG. 3D, a redistribution layer 116' is formed on the reconstructed structure as shown in FIG. 3B. The redistribution layer 116' can be same or similar to the redistribution layers 10' as shown in FIG. 1.

Forming the redistribution layer 116' on the structure as shown in FIG. 3C may include electrically connecting the redistribution layer 116' to the reconstructed structure. The redistribution layer 116' can be disposed on the insulation wall 12. The redistribution layer 116' can be formed on the unit 11a. The redistribution layer 116' can be formed on the unit 11b.

Figure 3E:
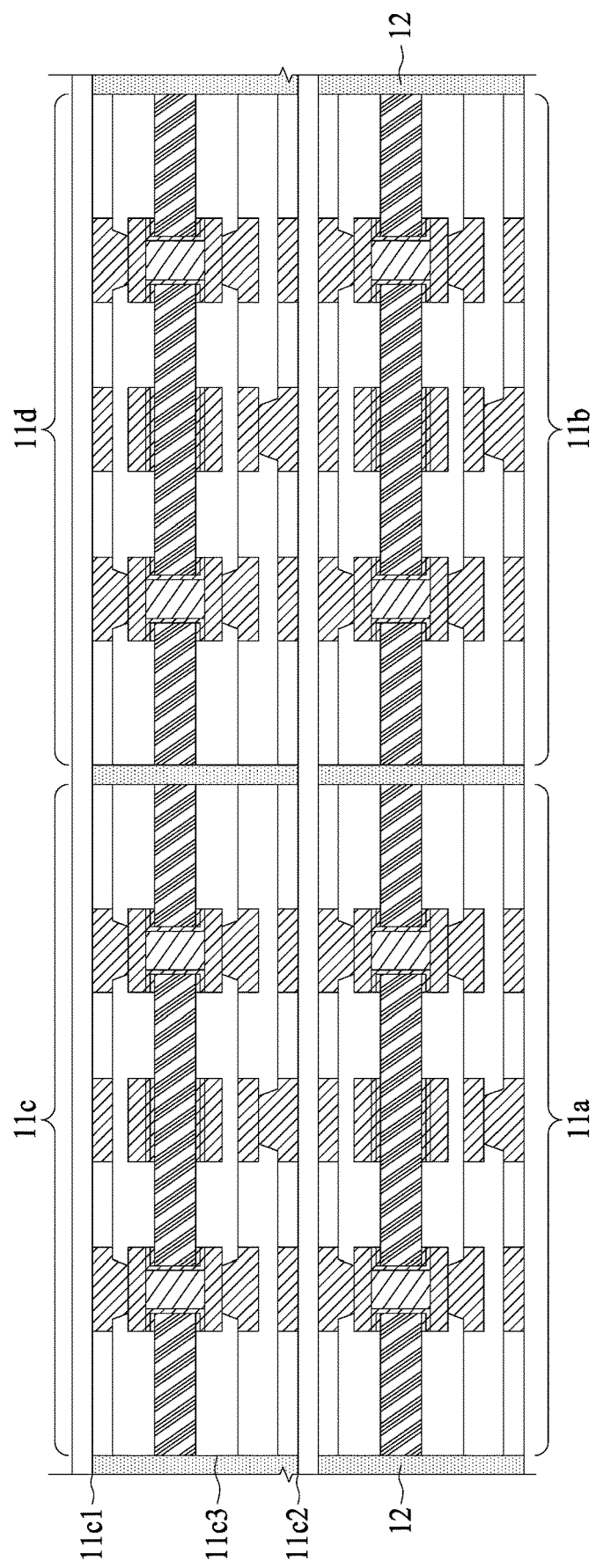

Referring to FIG. 3E, operations as shown in FIG. 3A, FIG. 3B and FIG. 3C can be repeated to form a stack structure or a panel of wiring structures 1 as shown in FIG. 1. A cutting technique can be applied or performed along the scribe lines S to form some wiring structures 11 as illustrated and described with reference to FIG. 3.

Each of the units 11c and 11d can have a surface 11c1, a surface 11c2 opposite the surface 11c2, and a surface 11c3 extended between the surface 11c1 and the surface 11c2. Encapsulating the units 11c and 11d can include encapsulating the surface 11c3 of each of the units 11c and 11d and exposing the surface 11c1 and the surface 11c2 of each of the units 11c and 11d.

The layer of units 11c and 11d can be stacked onto the layer of units 11a and 11b. Forming a redistribution layer 118' on the layer of units 11c and 11d can include electrically connecting the redistribution layer 118' to the layer of units 11c and 11d. The redistribution layer 118' can be disposed on the insulation wall 117'. The redistribution layer 118' can be formed on the unit 11c. The redistribution layer 118' can be formed on the unit 11d. The layer of units 11c and 11d can be stacked onto the redistribution layer 116'. Stacking the layer of units 11c and 11d onto the redistribution layer 116' can include electrically connecting the redistribution layer 116' to the layer of units 11c and 11d.

FIG. 3E illustrates a multi-layer structure substrate. As shown in FIG. 3E, the multi-layer structure substrate may have a layer having a number of units (e.g. units 11a and 11b) embedded in an insulation material 12. The multi-layer structure substrate may have a redistribution layer 116' disposed on the layer of units 11a and 11b. The multi-layer structure substrate can include a layer having a number of units (e.g. units 11c and 11d) embedded in an insulation material 12. The layer of the units 11c and 11d can be disposed on the redistribution layer 116'. One of the number of units (e.g. units 11a and 11b) can be separated from another by the insulation material 12. One of the number of units (e.g. units 11c and 11d) can be separated from another by the insulation material 12. The redistribution layer 118' can be disposed on the layer of units 11c and 11c. The redistribution layer 118' can be electrically connected to the layer of units 11c and 11d. The redistribution layer 116' can be electrically connected to the layer of units 11a and 11b. The redistribution layer 116' can be electrically connected to the layer of units 11c and 11d.

The operations as illustrated in FIG. 3A, FIG. 3B, FIG. 3C, FIG. 3D and FIG. 3E can improve yield rate. Assuming the panel of wiring structures 1 may include X units in total, and a rate of failure can be determined as $$\frac{1}{X} * 100\%$$

if a wiring structure unit is failed during manufacturing.

Assuming that a defect count for each layer of units in the panel of wiring structures 1 (e.g. layer 10 as shown in FIG. 1) is 6 units per layer, and a rate of failure for one single layer can be determined as $$\frac{1}{X} * 6 * 100\%.$$

Assuming that the panel of wiring structures 1 may include Y layers of wiring structure units, and a yield rate of the panel of wiring structures 1 can be determined as $$\left(1 - \frac{1}{X} * 6 * 100\%\right)^Y.$$

For example, assuming the panel of wiring structures 1 has 80 units and 10 layers, a five-layer structure may be formed by the method as described and illustrated with reference to FIG. 3A, FIG. 3B, FIG. 3C, FIG. 3D and FIG. 3E with a yield rate of approximately $$\left(1 - \frac{1}{20} * 6 * 100\%\right)^5 = (70\%)^5 = 16.8\%.$$

Another five-layer structure may be formed by the method as described and illustrated with reference to FIG. 3A, FIG. 3B, FIG. 3C, FIG. 3D and FIG. 3E with a yield rate of approximately $$\left(1 - \frac{1}{20} * 6 * 100\%\right)^5 = (70\%)^5 = 16.8\%.$$

Accordingly a ten-layer structure may be formed by stacking two five-layer structures with a yield rate of approximately $$\left(1 - \frac{1}{20} * 6 * 100\%\right)^5 = (70\%)^5 = 16.8\%.$$

Moreover, each of the units 11a, 11b, 11c, 11d, 11e, 11f, 11g, 11h and 11i may have pass the test and reconstructed in FIG. 3B, which can facilitate improvement of yield rate of the panel of wiring structures 1.

Figure 4:
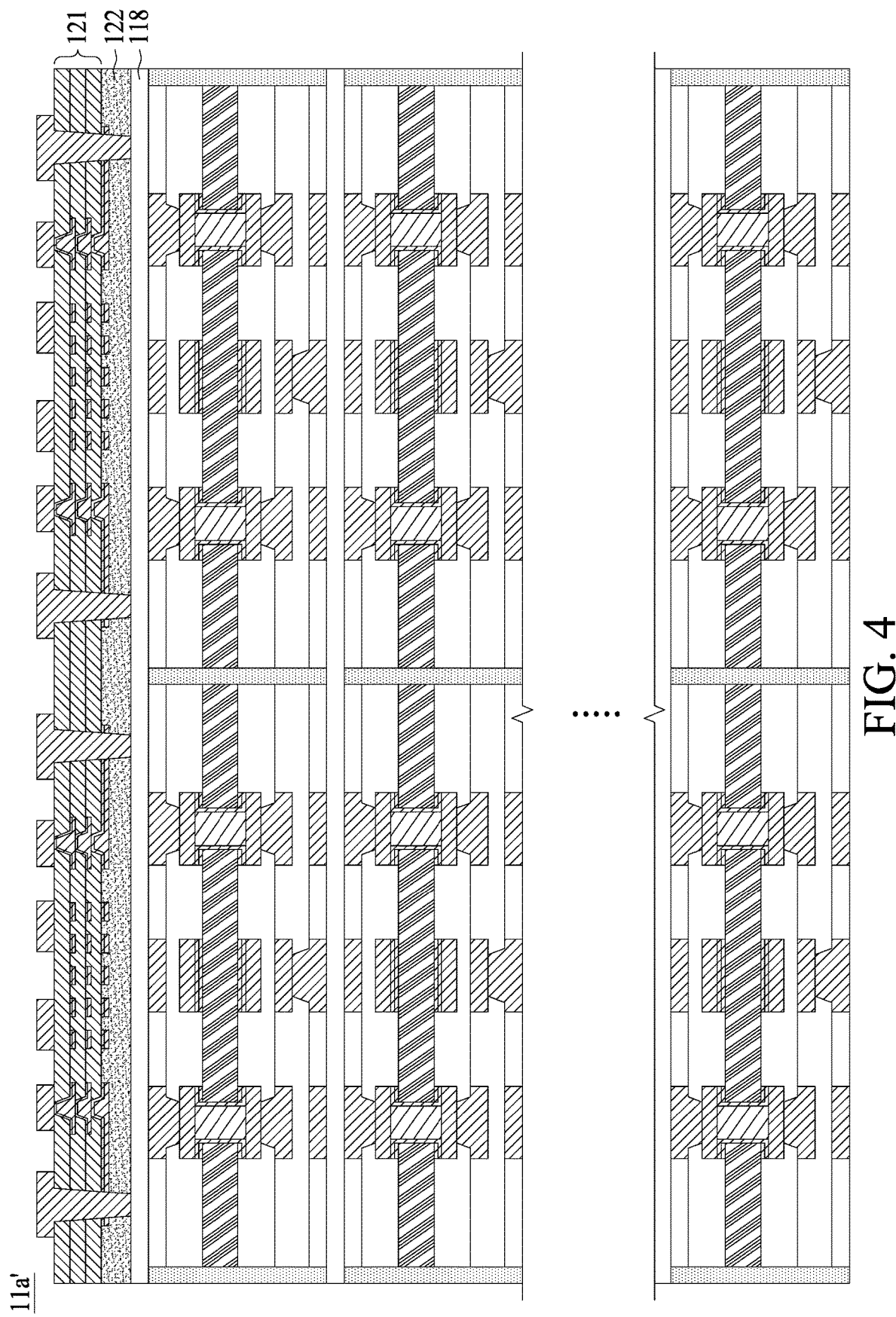
FIG. 4 illustrates a cross-sectional view of another wiring structure according to some embodiments of the present disclosure.

FIG. 4 illustrates a cross-sectional view of another wiring structure according to some embodiments of the present disclosure.

Referring to FIG. 4, the wiring structure 11a' is similar to the wiring structure 11 as illustrated and described with reference to FIG. 3, except that the wiring structure 11a' further includes a redistribution layer 121.

The redistribution layer 121 can be disposed on the redistribution layer 118. The wiring structure 11a can further include an intermediate layer 122, which can be disposed between the redistribution layers 118 and 121.

Figure 5:
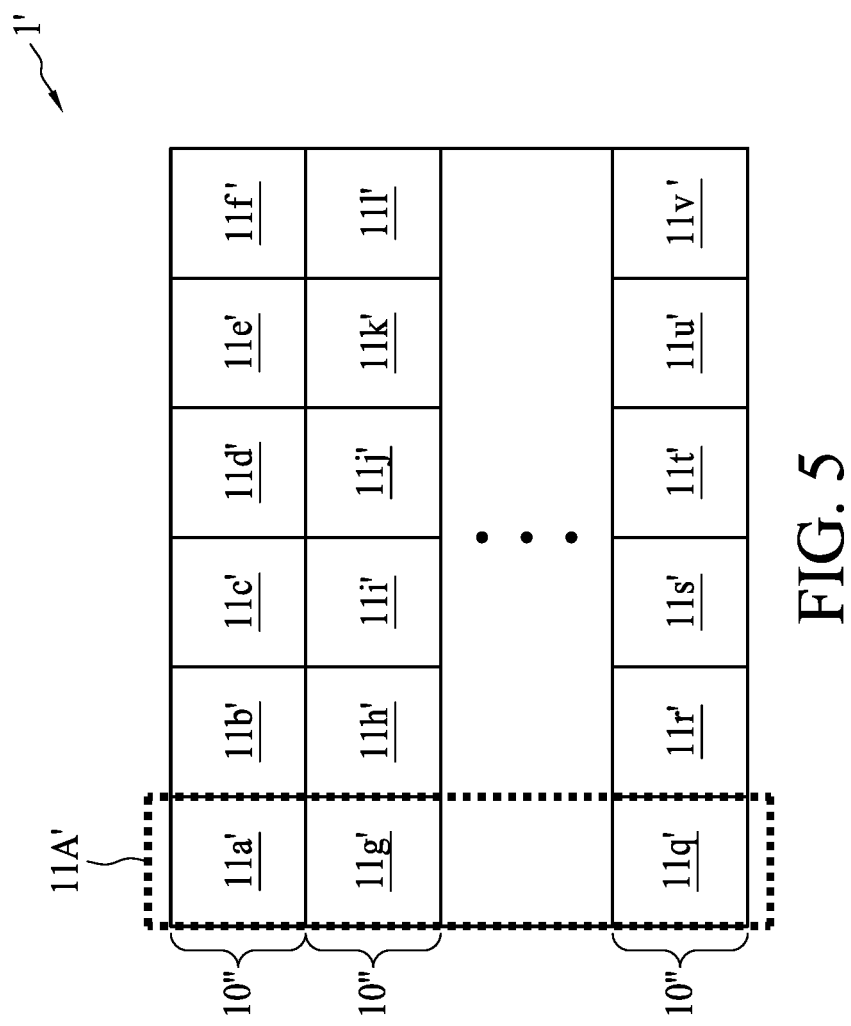
FIG. 5 illustrates a comparative embodiment of a panel of wiring structures of the present disclosure.

FIG. 5 illustrates a comparative embodiment of a panel of wiring structures of the present disclosure.

The panel of wiring structures 1' can include a stacked circuit layers 10". The circuit layer 10" can have some wiring structure units 11a' 11b', 11c' 11d' . . . . The panel of wiring structures 1' may have no distribution layer disposed between a circuit layer 10" and another adjacent circuit layer 10". The circuit layer 10" is different from the layer 10 as shown in FIG. 1. The circuit layer 10" is devoid of encapsulation material. The panel of wiring structures 1' can be formed by stacking the circuit layers 10".

Assuming the panel of wiring structures 1' may include X units in total, and a rate of failure can be determined as $$\frac{1}{X} * 100\%$$

if a wiring structure unit is failed during manufacturing.

Assuming that a defect count for each layer of units in the panel of wiring structures 1' (e.g. layer 10" as shown in FIG. 5) is 6 units per layer, and a rate of failure for one single layer can be determined as $$\frac{1}{X} * 6 * 100\%.$$

Assuming that the panel of wiring structures 1' may include Y layers of wiring structure units, and a yield rate of the panel of wiring structures 1' can be determined as $$\left(1 - \frac{1}{X} * 6 * 100\%\right)^Y.$$

For example, assuming the panel of wiring structures 1' has 20 units and 10 layers, a ten-layer structure 1' may be formed by the stacking method as described above with a yield rate of approximately $$\left(1 - \frac{1}{20} * 6 * 100\%\right)^{10} = (70\%)^{10} = 2.8\%.$$

Moreover, each failed unit in one single circuit layer 10" may cause failure of a wiring structure 11A', which may adversely affect yield rate of the panel of wiring structures 1'.

Figure 6A:
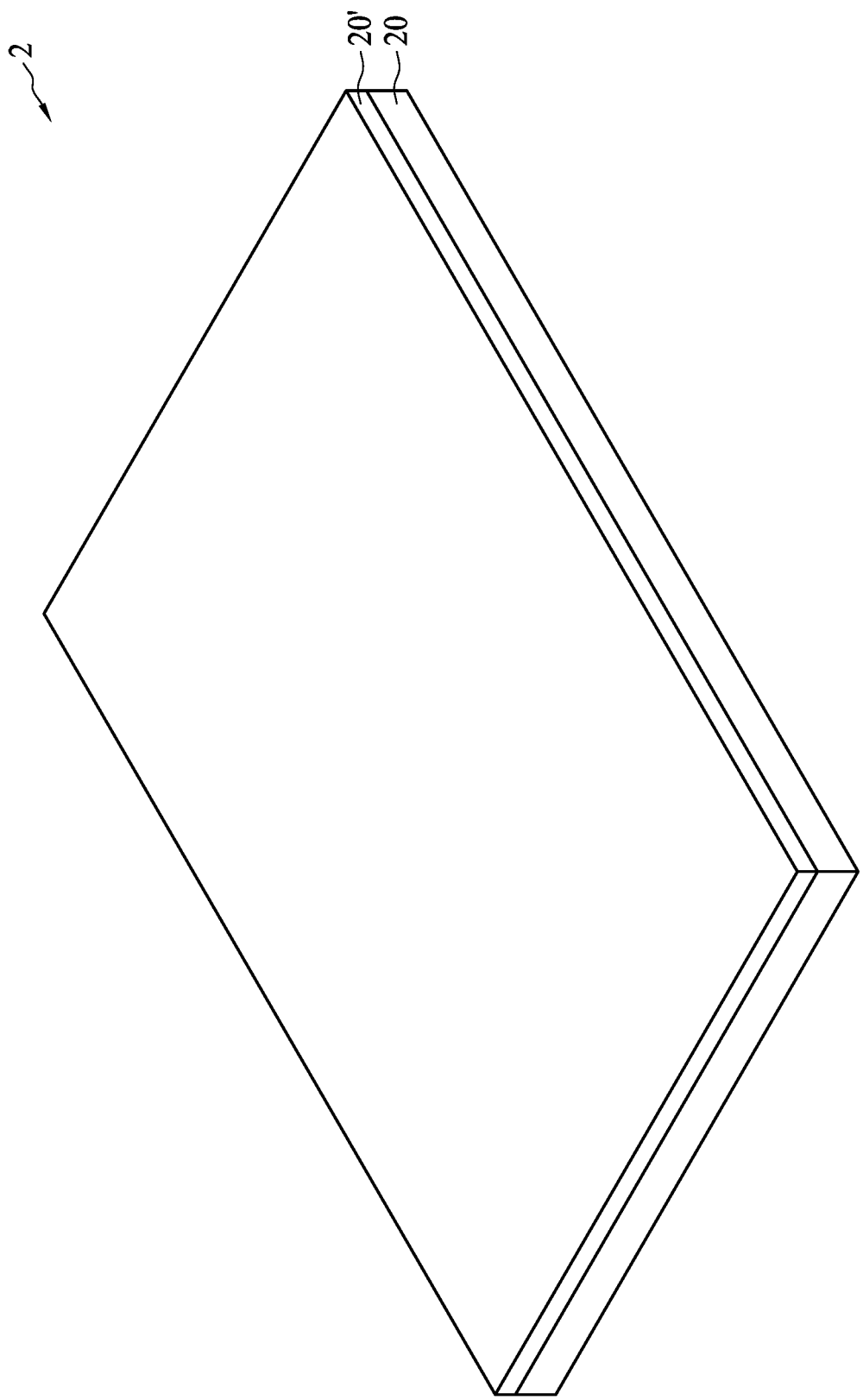
FIG. 6A illustrates an assembly view of a panel of wiring structures according to some embodiments of the present disclosure.

FIG. 6A illustrates an assembly view of a panel of wiring structures according to some embodiments of the present disclosure.

Referring to FIG. 6A, the panel of wiring structures 2 may include layers 20 and redistribution layers 20'. The panel 2 can include a multi-layer structure. The panel 2 may include a stack structure of layers 20 and redistribution layers 20'.

Although it is not illustrated in FIG. 6A, it is contemplated that the panel of wiring structures 2 can include more layers 20' and 20 stacked to one another. Although it is not illustrated in FIG. 6A, it is contemplated that the panel of wiring structures 2 can include more layers 20' and 20 interleaved with one another.

Figure 6B:
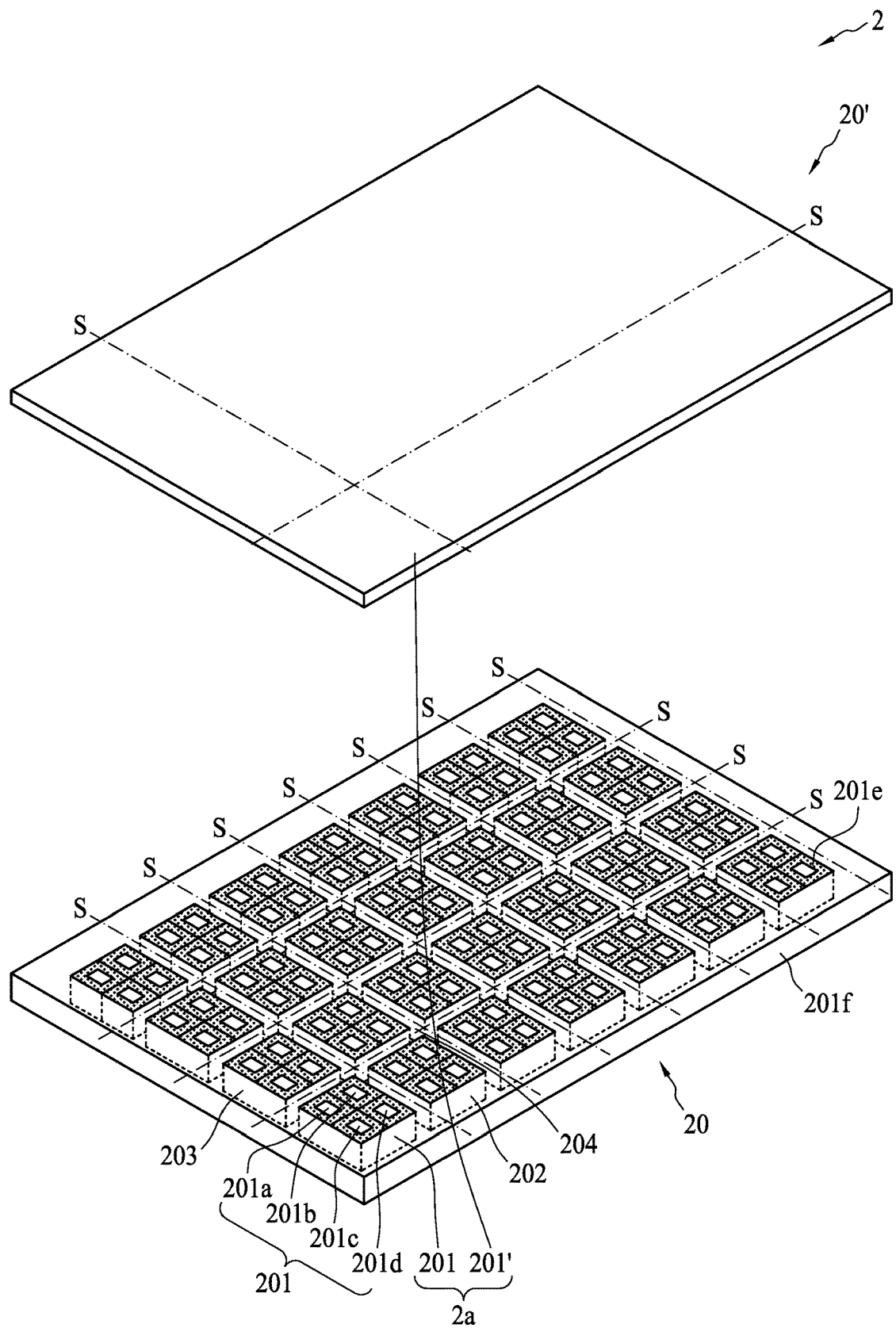
FIG. 6B illustrates an exploded view of the panel of wiring structures as shown in FIG. 6A.

FIG. 6B illustrates an exploded view of the panel of wiring structures as shown in FIG. 6A.

Referring to FIG. 6B, a wiring structure 2a can include a multi-layer structure. The wiring structure 2a, which may include unit 201 and redistribution unit 201', can be separated from the panel 2 by using cutting technique along the cutting lines (or scribe lines) S. Although the wiring structures of the panel 2 are arranged or disposed in a rectangular or rectangle-like shape in FIG. 6B, however, it is contemplated that the wiring structures can be arranged in a shape other than the above.

Referring to FIG. 6B, the layer 20 can include various units (e.g. units 201, 202, 203, 204 ... ). The unit 201 can include sub-unit 201a, sub-unit 201b, sub-unit 201c and sub-unit 201d. Although FIG. 6B illustrates a unit 201 of the layer 20 can have four sub-units 201a, 201b, 201c and 201d, however, it is contemplated that unit 201 of the layer 20 can include more or less sub-unit(s) in some other embodiments of the present disclosure. The sub-units 201a, 201b, 201c and 201d can be encapsulated by an insulation material 201e. The sub-units 201a, 201b, 201c and 201d can be surrounded by the insulation material 201e. The sub-units 201a, 201b, 201c and 201d can be enclosed by an insulation material 201e. The sub-units 201a, 201b, 201c and 201d can be in direct contact with the insulation material 201e.

The units of layer 20 (e.g. units 201, 202, 203, 204 ... ) can be encapsulated by an insulation material 201f. The units of layer 20 (e.g. units 201, 202, 203, 204 ... ) can be surrounded by the insulation material 201f. The units of layer 20 (e.g. units 201, 202, 203, 204 ... ) can be enclosed by the insulation material 201f. The units of layer 20 (e.g. units 201, 202, 203, 204 ... ) can be in direct contact with the insulation material 201f.

Figure 7A:
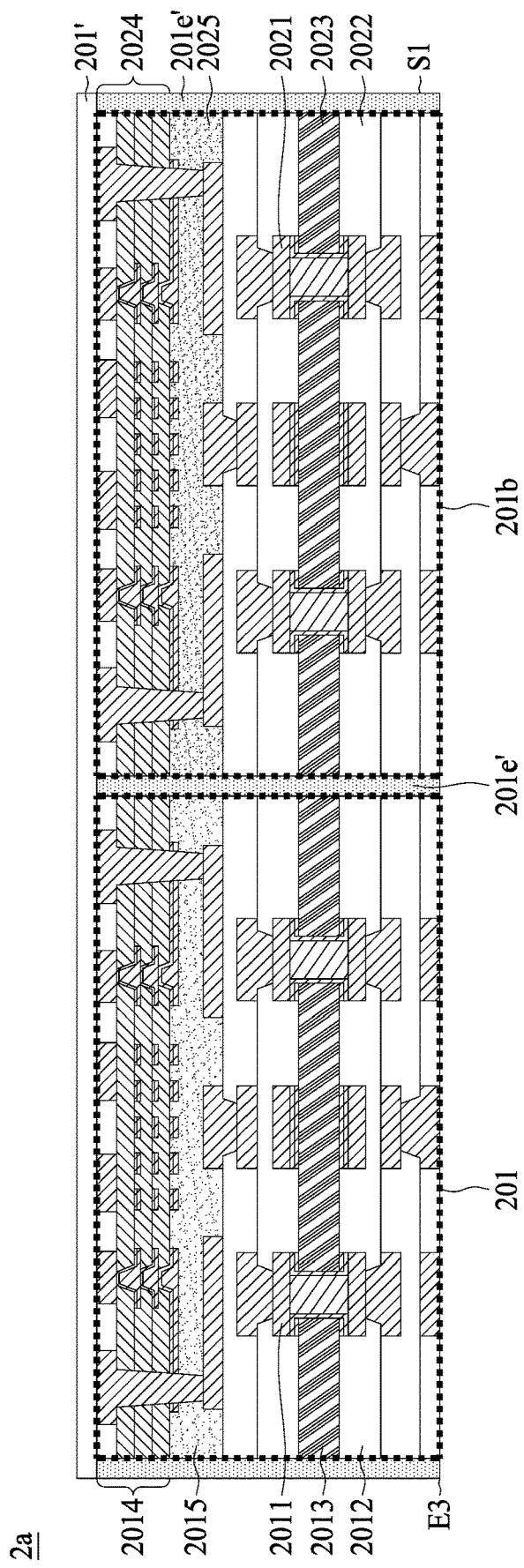
FIG. 7A illustrates a cross-sectional view of a wiring structure according to some embodiments of the present disclosure.

FIG. 7A illustrates a cross-sectional view of a wiring structure 2a as shown in FIG. 6B. The wiring structure 2a may include sub-unit 201a, sub-unit 201b, sub-unit 201c (not shown in FIG. 7A), sub-unit 201d (not shown in FIG. 7A), and the redistribution unit 201'.

The redistribution unit 201' can be disposed on the sub-unit 201a. The redistribution unit 201' can be disposed on the sub-unit 201b. The redistribution unit 201' can be disposed on the sub-unit 201c. The redistribution unit 201' can be disposed on the sub-unit 201d. The redistribution unit 201' can be electrically connected to the sub-unit 201a. The redistribution unit 201' can be electrically connected to the sub-unit 201b. The redistribution unit 201' can be electrically connected to the sub-unit 201c. The redistribution unit 201' can be electrically connected to the sub-unit 201d.

The sub-unit 201a can be disposed at an elevation E3. The sub-unit 201a may have a circuit layer 2011. The sub-unit 201a may have a dielectric layer 2012. The dielectric layer 2012 can surround the circuit layer 2011. The sub-unit 201a can have a core 2013. The core 2013 can be eliminated in some other embodiments of the present disclosure.

The sub-unit 201b can be disposed at an elevation which is substantially the same to elevation E3. The sub-unit 201b may have a circuit layer 2021. The sub-unit 201b may have a dielectric layer 2022. The dielectric layer 2022 can surround the circuit layer 2021. The sub-unit 201b may have a core 2023. The core 2023 can be eliminated in some other embodiments of the present disclosure. The sub-unit 201b can have a structure same or similar to the sub-unit 201a.

The wiring structure 2a can have an insulation wall 201e' disposed between sub-unit 201a and sub-unit 201b. The wiring structure 2a can have an insulation wall 201e' disposed between sub-unit 201a and sub-unit 201c. The wiring structure 2a can have an insulation wall 201e' disposed between sub-unit 201a and sub-unit 201d. The wiring structure 2a can have an insulation wall 201e' disposed between sub-unit 201b and sub-unit 201c. The wiring structure 2a can have an insulation wall 201e' disposed between sub-unit 201b and sub-unit 201d. The wiring structure 2a can have an insulation wall 201e' disposed between sub-unit 201c and sub-unit 201d.

The insulation wall 201e' can surround the sub-unit 201a. The insulation wall 201e' can surround the sub-unit 201b. The insulation wall 201e' can surround the sub-unit 201c. The insulation wall 201e' can surround the sub-unit 201d. The insulation wall 201e' can enclose the sub-unit 201a. The insulation wall 201e' can enclose the sub-unit 201b. The insulation wall 201e' can enclose the sub-unit 201c. The insulation wall 201e' can enclose the sub-unit 201d. The insulation wall 201e' can be in direct contact with the sub-unit 201a. The insulation wall 201e' can be in direct contact with the sub-unit 201b. The insulation wall 201e' can be in direct contact with the sub-unit 201c. The insulation wall 201e' can be in direct contact with the sub-unit 201d.

The insulation wall 201e' may include materials substantially different from the dielectric layer 2012. The insulation wall 201e' may include materials substantially the same to the dielectric layer 2012. The insulation wall 201e' may include encapsulant(s) or encapsulation material. The insulation wall 201e' may include particles. The insulation wall 201e' may include resin and fillers (or particles). The insulation wall 201e' may include molding compound. The insulation wall 201e' may include thermoset material(s). The insulation wall 201e' may include thermoplastic material(s).

Each of the subunits (e.g. sub-unit 201a, sub-unit 201b, sub-unit 201c and sub-unit 201d) can include a redistribution layer. For example, the sub-unit 201a can include a redistribution layer 2014. For example, the sub-unit 201b can include a redistribution layer 2024.

Each of the subunits (e.g. sub-unit 201a, sub-unit 201b, sub-unit 201c and sub-unit 201d) can include an intermediate layer disposed between the redistribution layer and the circuit layer. For example, the sub-unit 201a can include an intermediate layer 2015 disposed between the redistribution layer 2014 and the circuit layer 2011. For example, the sub-unit 201b can include an intermediate layer 2025 disposed between the redistribution layer 2024 and the circuit layer 2021.

The insulation wall 201e' can include a material substantially same or similar to the dielectric layer 2022. The insulation wall 201e' can include a material substantially different from the dielectric layer 2022. The insulation wall 201e' can surround the redistribution layer 2014. The insulation wall 201e' can enclose the redistribution layer 2014. The insulation wall 201e' can be in direct contact with the redistribution layer 2014.

The insulation wall 201e' can surround the redistribution layer 2024. The insulation wall 201e' can encloses the redistribution layer 2024. The insulation wall 201e' can be in direct contact with the redistribution layer 2024.

The redistribution layer 201' can be disposed on the insulation wall 201e'. The redistribution layer 201' can be in direct contact with the insulation wall 201e'.

The insulation wall 201e' can have a lateral surface S1 exposed to the air. The redistribution layer 201' can have a lateral surface (not denoted). The redistribution layer 201' can have a lateral surface (not denoted) which can be substantially coplanar with the surface S1 of the insulation wall 201e'. The surface S1 of the insulation wall 201e' may have a relatively great surface roughness.

The circuit layer 2011 may have a pitch substantially same to the circuit layer 2012. The circuit layer 2011 may have a wire length/space substantially same to the circuit layer 2012. The circuit layer 2011 may have a pitch substantially same to the redistribution layer 201'. The circuit layer 2011 may have a wire length/space substantially same to the redistribution layer 201'. The circuit layer 2011 may have a pitch substantially different from the redistribution layer 201'. The circuit layer 2011 may have a wire length/space substantially different from the redistribution layer 201'. The circuit layer 2011 may have a pitch of approximately 10 μm. The circuit layer 2011 may have a wire length/space of approximately 10 μm/10 μm. The circuit layer 2011 may have a wire length/space less than approximately 10 μm/10 μm.

The redistribution layer 2014 may have a pitch substantially different from the circuit layer 2012. The redistribution layer 2014 may have a pitch substantially less than the circuit layer 2012. The redistribution layer 2014 may have a wire length/space substantially different from the circuit layer 2012. The redistribution layer 2014 may have a wire length/space substantially less than the circuit layer 2012. The redistribution layer 2014 may have a wire length/space substantially different from the redistribution layer 201'. The redistribution layer 2014 may have a wire length/space substantially less than the redistribution layer 201'.

The redistribution layer 2014 may include fan-out layer. The redistribution layer 2014 may have a wire length/space of approximately 2 μm/2 μm. The redistribution layer 2014 may have a wire length/space less than approximately 2 μm/2 μm. The redistribution layer 2014 can help to reduce size of the subunit 201a. The redistribution layer 2014 can help to reduce thickness of the subunit 201a.

The redistribution layer 2024 can have a structure similar or same to the redistribution layer 2014

Figure 7B:
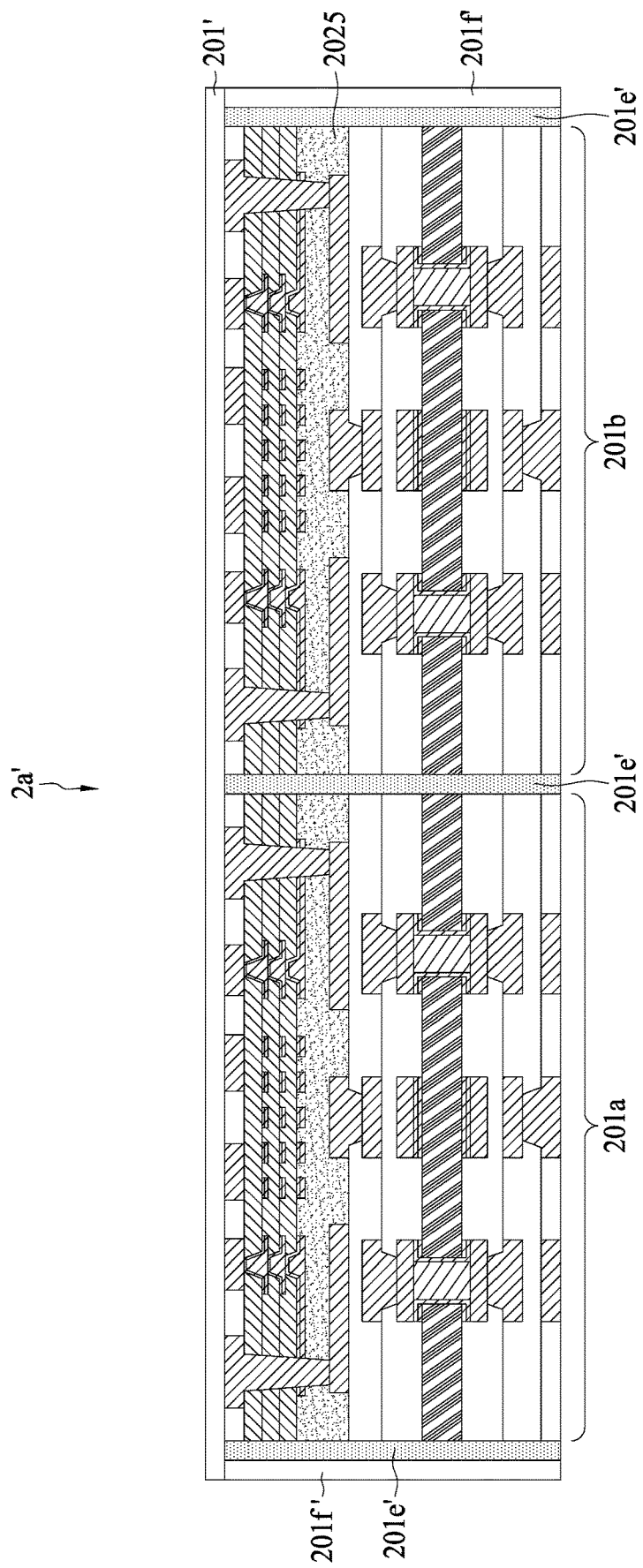
FIG. 7B illustrates a cross-sectional view of another wiring structure according to some embodiments of the present disclosure.

FIG. 7B illustrates a cross-sectional view of another wiring structure according to some embodiments of the present disclosure.

Referring to FIG. 7B, the wiring structure 2a' is similar to the wiring structure 2a as illustrated and described with reference to FIG. 7A, except that the wiring structure 2a' can further include an insulation wall 201f.

The insulation wall 201f can surround the sub-unit 201a. The insulation wall 201f can surround the sub-unit 201b. The insulation wall 201f can surround the sub-unit 201c. The insulation wall 201f can surround the sub-unit 201d. The insulation wall 201f can surround the insulation wall 201e'.

The insulation wall 201f can enclose the sub-unit 201a. The insulation wall 201f can enclose the sub-unit 201b. The insulation wall 201f can enclose the sub-unit 201c. The insulation wall 201f can enclose the sub-unit 201d. The insulation wall 201f can enclose the insulation wall 201e'.

The insulation wall 201f can be separated or spaced from the sub-unit 201a by the insulation wall 201e'. The insulation wall 201f can be separated or spaced from the sub-unit 201b by the insulation wall 201e'. The insulation wall 201f can be separated or spaced from the sub-unit 201c by the insulation wall 201e'. The insulation wall 201f can be separated or spaced from the sub-unit 201d by the insulation wall 201e'.

The insulation wall 201e' can be disposed between the sub-unit 201a and the insulation wall 201f. The insulation wall 201e' can be disposed between the sub-unit 201b and the insulation wall 201f. The insulation wall 201e' can be disposed between the sub-unit 201c and the insulation wall 201f. The insulation wall 201e' can be disposed between the sub-unit 201d and the insulation wall 201f.

The insulation wall 201f can be in direct contact with the insulation wall 201e'. The insulation wall 201f can be in direct contact with the redistribution layer 201'. The insulation wall 201e' can be in direct contact with the redistribution layer 201'. The redistribution layer 201' can be disposed on the insulation wall 201e'. The redistribution layer 201' can be disposed on the insulation wall 201f.

The insulation wall 201f may include materials substantially different from the insulation wall 201e'. The insulation wall 201f may include materials substantially the same to the insulation wall 201e'. The insulation wall 201f may include encapsulant(s) or encapsulation material. The insulation wall 201f may include particles. The insulation wall 201f may include resin and fillers (or particles). The insulation wall 201f may include molding compound. The insulation wall 201f may include thermoset material(s). The insulation wall 201f may include thermoplastic material(s).

FIG. 8A, FIG. 8B, FIG. 8C, FIG. 8D and FIG. 8E illustrate a method of manufacturing a wiring structure according to some embodiments of the present disclosure.

Figure 8B:
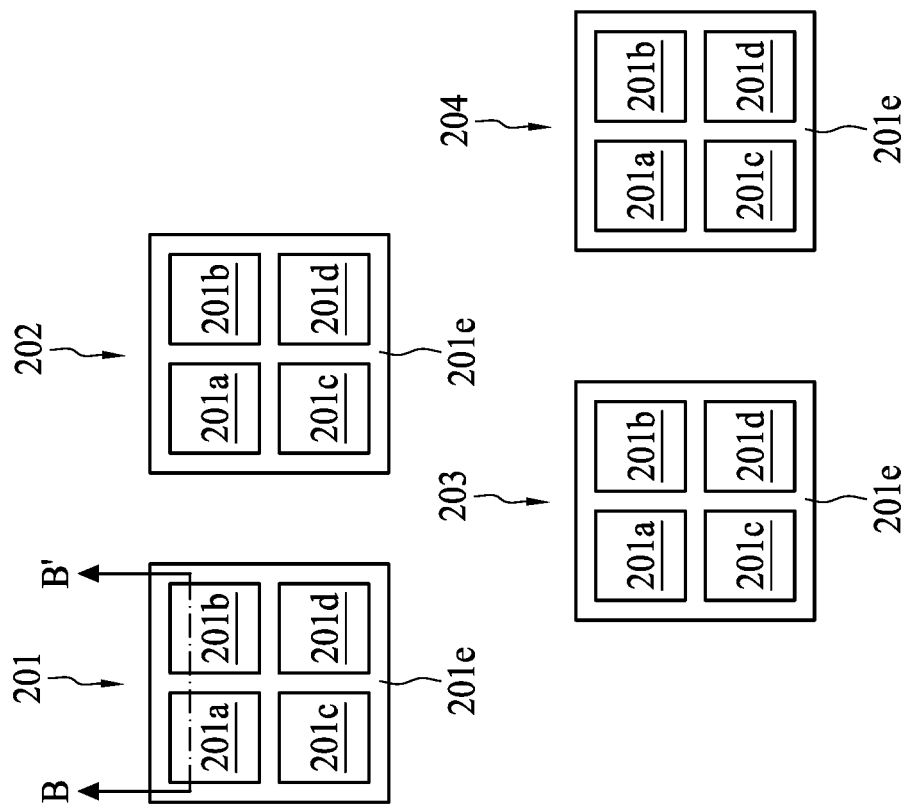
FIG. 8A, FIG. 8B, FIG. 8C, FIG. 8D and FIG. 8E illustrate a method of manufacturing a wiring structure according to some embodiments of the present disclosure.
Figure 8A:
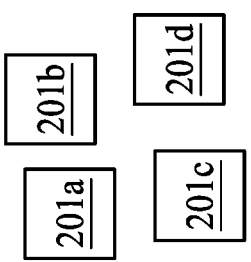

FIG. 8A illustrates some sub-units 201a, 201b, 201c and 201d, which may pass test(s) and may be called as good sub-unit(s) or functional sub-units.

FIG. 8B illustrates some units 201 having the sub-units as shown in FIG. 8A.

Referring to FIG. 8B, the unit 201 can include sub-unit 201a, the sub-unit 201b, the sub-unit 201c and the sub-unit 201d. The sub-unit 201a, the sub-unit 201b, the sub-unit 201c and the sub-unit 201d can be arranged, disposed or constructed in a pattern, for example but is not limited to a square, a square-like shape, a rectangle, a rectangle-like shape, a round shape or other shapes. One of the sub-units 201a, 201b, 201c and 201d may be surrounded by an insulation wall 201e' or insulation material 201e'. One of the sub-units 201a, 201b, 201c and 201d may be enclosed by an insulation wall 201e' or insulation material 201e'. An insulation wall 201e' or encapsulation material 201e' may encapsulate the sub-units 201a, 201b, 201c and 201d. Encapsulation material 201e' may be used to encapsulate the sub-units 201a, 201b, 201c and 201d by, for example but is not limited to, molding technique. An insulation wall 201e' or encapsulation material 201e' may be in direct contact with a lateral surface (not denoted) of one of the sub-units 201a, 201b, 201c and 201d.

Figure 8C:
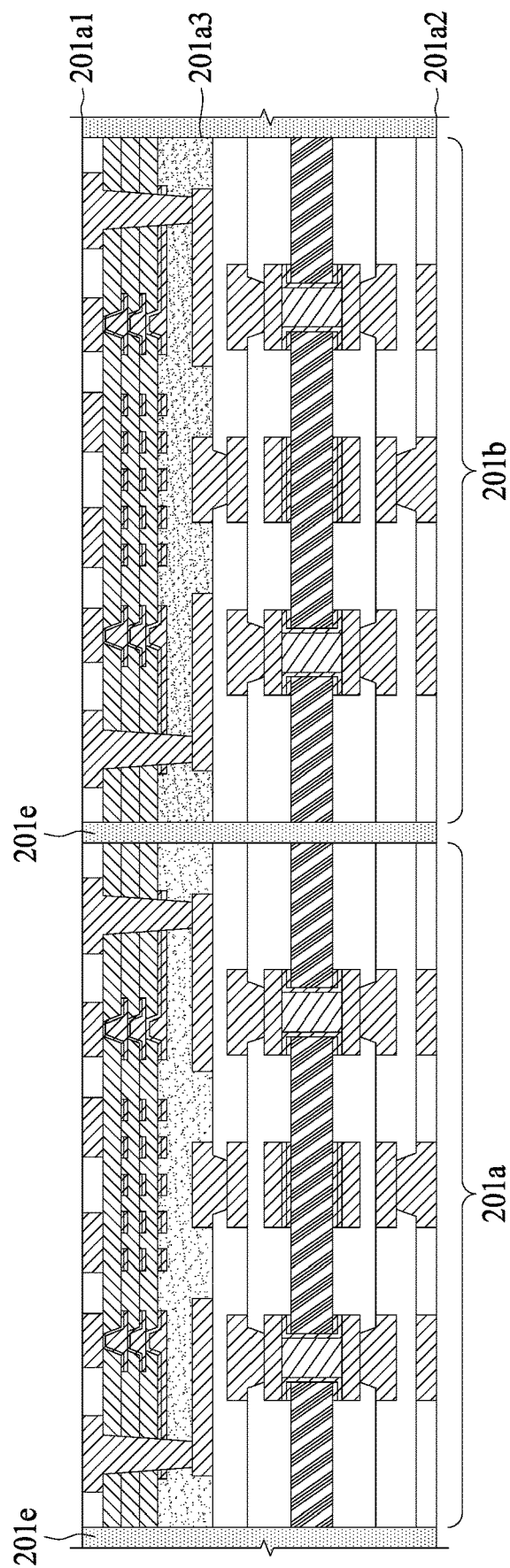

FIG. 8C illustrates a cross-sectional view of the structure across line BB' as shown in FIG. 8B.

Referring to FIG. 8C, sub-units 201a and 201b can be disposed at a substantially same elevation. The sub-units 201a and 201b can be separated by the insulation wall 201e. The insulation wall 201e can surround the sub-unit 201a. The insulation wall 201e can surround the sub-unit 201b. The insulation wall 201e can enclose the sub-unit 201a. The insulation wall 201e encloses the sub-unit 201b. The insulation wall 201e can be in direct contact with the sub-unit 201a. The insulation wall 201e can be in direct contact with the sub-unit 201b. The insulation wall 201e can be in direct contact with a lateral surface (not denoted) of the sub-unit 201a. The insulation wall 201e can be in direct contact with a lateral surface (not denoted) of the sub-unit 201b.

As shown in 8C, each of the sub-units 201a and 201b has a surface 201a1, a surface 201a2 opposite the surface 201a1, and a surface 201a3 extended between the surface 201a1 and the surface 201a2. Encapsulating the sub-units 201a and 201b to form the layer of sub-units includes encapsulating the surface 201a3 of each of the sub-units 201a and 201b and exposing the surface 201a1 and the surface 201a2 of each of the sub-units 201a and 201b.

Figure 8D:
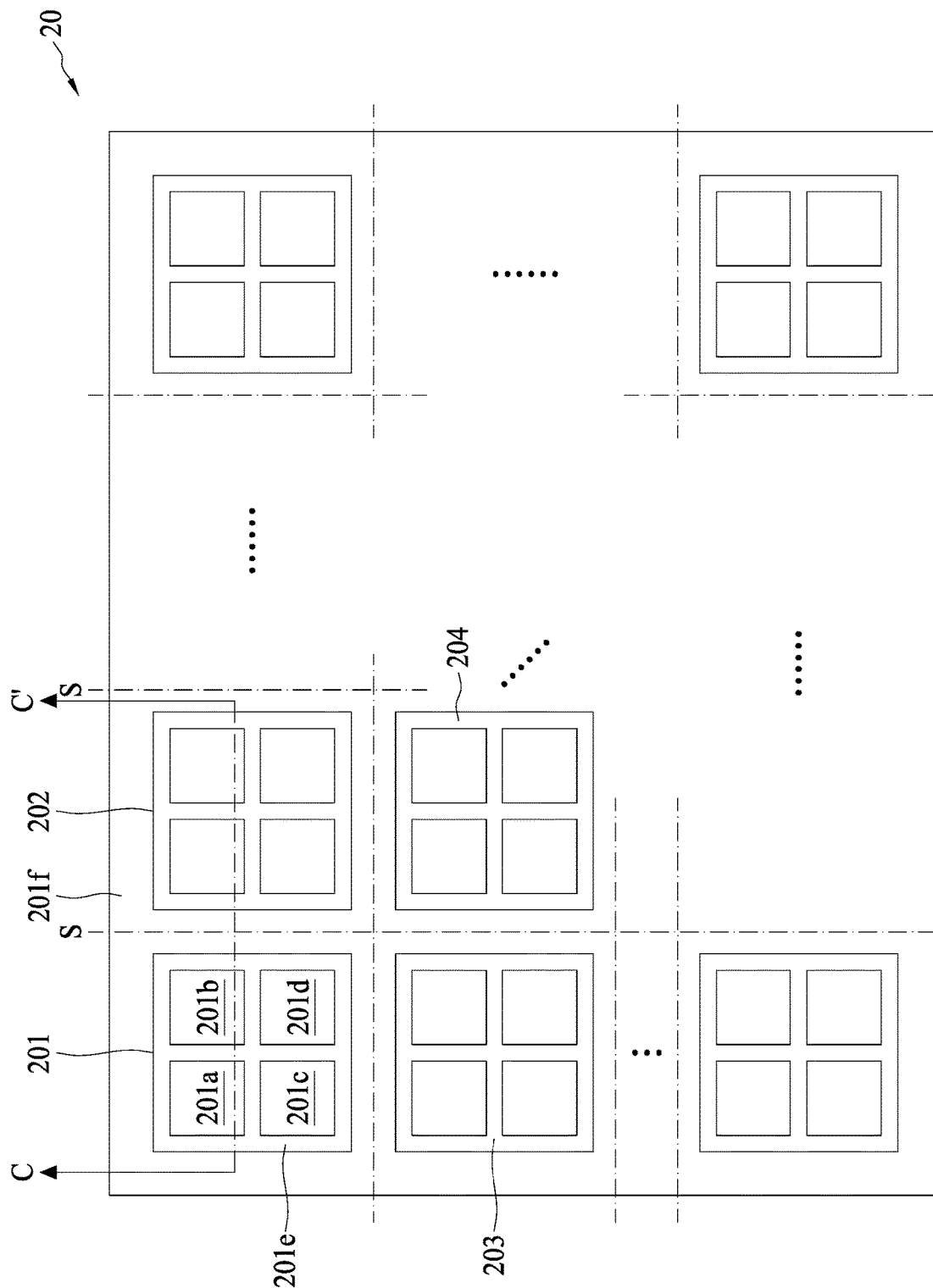

FIG. 8D illustrates a layout of the layer 20 as shown in FIG. 6B.

Referring to FIG. 8D, the units 201, 202, 203, 204 . . . as shown in FIG. 8B can be arranged, disposed or constructed in a pattern, for example but is not limited to a square, a square-like shape, a rectangle, a rectangle-like shape, a round shape or other shapes. One of the units 201, 202, 203, 204 . . . may be surrounded by an insulation wall 201f or insulation material 201f. One of the units 201, 202, 203, 204 . . . may be enclosed by an insulation wall 201f or insulation material 201f. An insulation wall 201f or encapsulation material 201f may encapsulate the units 201, 202, 203, 204 . . . . Encapsulation material 201f may be used to encapsulate the units 201, 202, 203, 204 by, for example but is not limited to, molding technique.

Figure 8E:
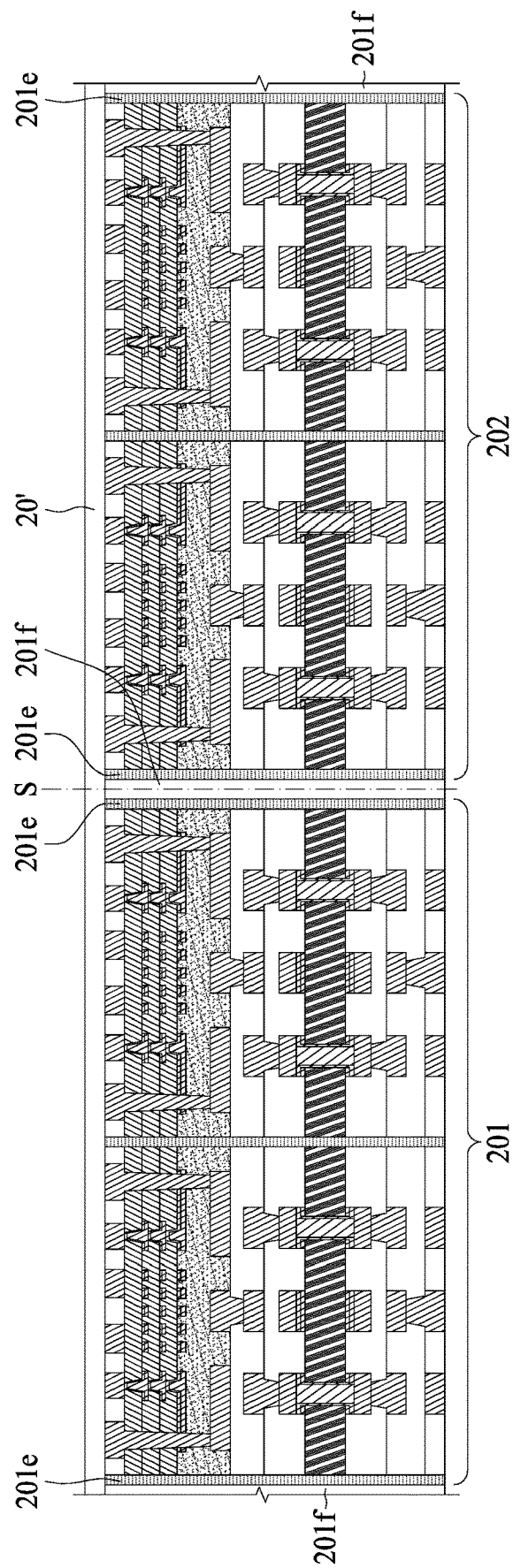

Referring to FIG. 8E, which illustrates a redistribution layer 20' can be formed on the layer 20 and a cross-sectional view of the structure across line CC' as shown in FIG. 8D.

Forming a redistribution layer 20' on the layer 20 can include electrically connecting the redistribution layer 20' to the layer 20. The redistribution layer 20' can be disposed on the insulation wall 201f. The redistribution layer 20' is can be on the unit 201. The redistribution layer 20' can be formed on the unit 202.

A cutting technique can be performed along the scribe lines S to form some wiring structures 2a as shown in FIG. 7A. A cutting technique can be performed along the scribe lines S to form some wiring structures 2a' as shown in FIG. 7B. For example, a tool (e.g. knife) having relatively great width can be used to perform the cutting operation in FIG. 8E to form some wiring structures 2a as shown in FIG. 7A. For example, a tool (e.g. knife) having relatively less width can be used to perform the cutting operation in FIG. 8E to form some wiring structures 2a' as shown in FIG. 7B.

The operations as illustrated in FIG. 8A, FIG. 8B, FIG. 8C, FIG. 8D and FIG. 8E can improve yield rate.

Assuming the panel of wiring structures 2 (as shown in FIG. 6A) may include X units in total, and a rate of failure can be determined as $$\frac{1}{X} * 100\%$$

if one wiring structure unit is failed during manufacturing.

Assuming that a defect count for each layer of units in the panel of wiring structures 2 (e.g. layer 20 as shown in FIG. 1) is 6 units per layer, and a rate of failure for one single layer can be determined as $$\frac{1}{X} * 6 * 100\%.$$

Assuming that the panel of wiring structures 2 may include Y layers of wiring structure units, and a yield rate of the panel of wiring structures 1' can be determined as $$\left(1 - \frac{1}{X} * 6 * 100\%\right)^Y.$$

Assuming that each unit of the panel of wiring structures 2 may include Z sub-units, and a yield rate of the panel of wiring structures 2 can be determined as $$\left(1 - \frac{1}{X*Z} * 6 * 100\%\right)^Y.$$

For example, assuming the panel of wiring structures 2 has 20 units and 10 layers and each unit has 4 sub-units, a ten-layer structure may be formed by the method as described and illustrated with reference to FIG. 8A, FIG. 8B, FIG. 8C, FIG. 8D and FIG. 8E with a yield rate of approximately $$\left(1 - \frac{1}{20*4} * 6 * 100\%\right)^{10} = (92.5\%)^{10} = 45.86\%.$$

Moreover, each of the units 201, 202, 203, 204 . . . may have pass the test and reconstructed in FIG. 8E, which can facilitate improvement of yield rate of the panel of wiring structures 2. Moreover, each of the subunits 201a, 201b, 201c, 201d . . . may have pass the test and reconstructed in FIG. 8E, which can facilitate improvement of yield rate of the panel of wiring structures 2.

Figure 9:
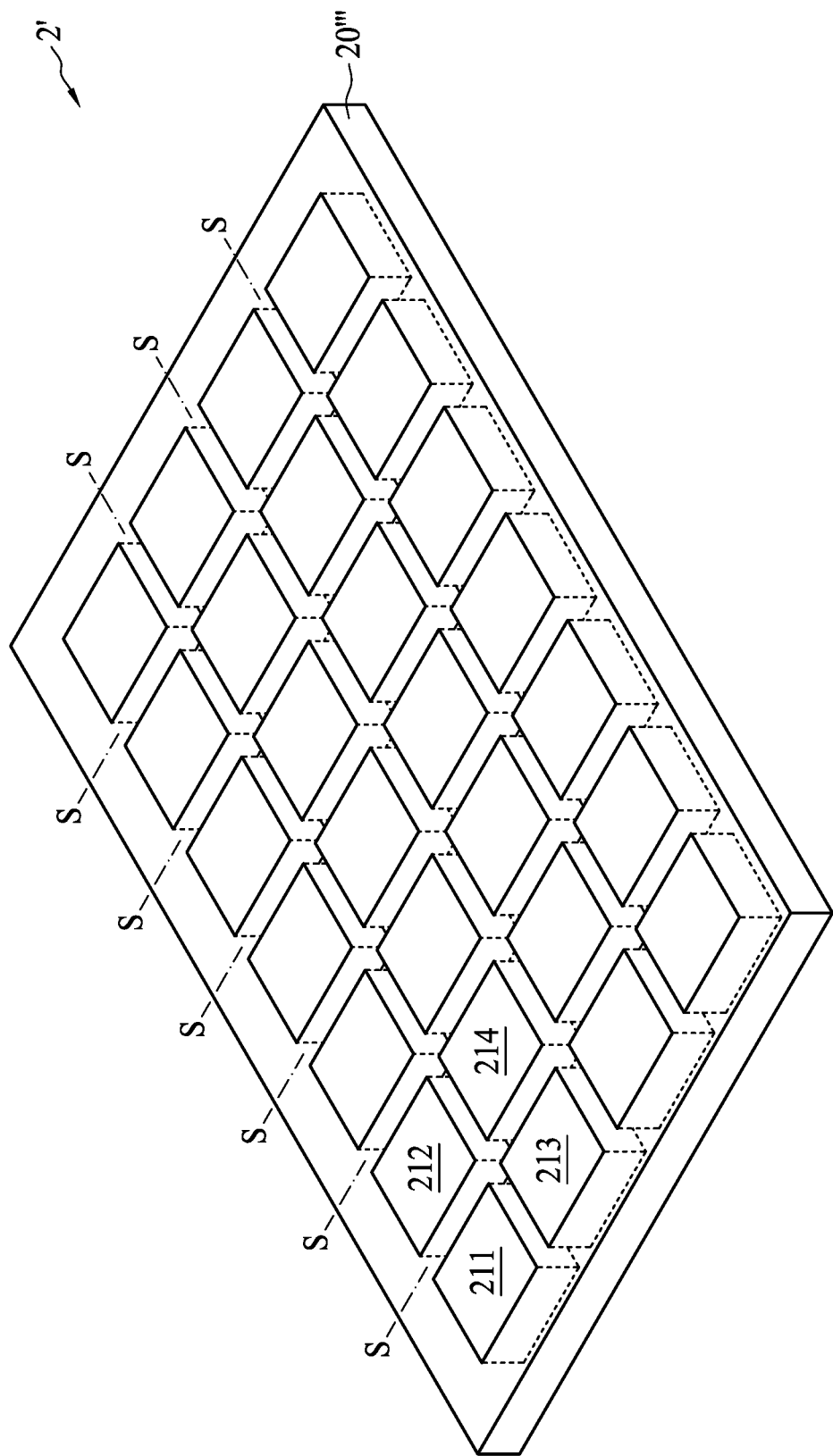
FIG. 9 illustrates a comparative embodiment of a wiring structure of the present disclosure.

FIG. 9 illustrates a comparative embodiment of a panel of wiring structures of the present disclosure.

The panel of wiring structures 2' can include a circuit layer 20'''. The circuit layer 20''' can have some wiring structure units 211, 212. 213. 214 . . . . The unit 211 is different from the unit 201 as shown in FIG. 6B and FIG. 8B. The unit 211 is devoid of sub-units. Although it is not illustrated in FIG. 9, it is contemplated that the panel of wiring structures 2' can include more circuit layers 20''.

Assuming the panel of wiring structures 2' may include X units in total, and a rate of failure can be determined as it a wiring structure unit is failed during manufacturing.

$$\frac{1}{X} * 100\%$$

Assuming that a defect count for each layer of units in the panel of wiring structures 2' (e.g. layer 20''' as shown in FIG. 9) is 6 units per layer, and a rate of failure for one single layer can be determined as $$\frac{1}{X} * 6 * 100\%.$$

Assuming that the panel of wiring structures 2' may include Y layers of wiring structure units, and a yield rate of the panel of wiring structures 2' can be determined as $$\left(1 - \frac{1}{X} * 6 * 100\%\right)^Y.$$

For example, assuming the panel of wiring structures 2' has 20 units and 10 layers and each unit is devoid of sub-units, a ten-layer structure 2' may be formed by the stacking method as described above with a yield rate of approximately $$\left(1 - \frac{1}{20} * 6 * 100\%\right)^{10} = (70\%)^{10} = 2.8\%.$$

Moreover, each failed unit in one single circuit layer 20'' may cause failure of a wiring structure, which may adversely affect yield rate of the panel of wiring structures 2'.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A wiring structure, comprising:
 a first unit disposed at a first elevation and having a first circuit layer and a first dielectric layer surrounding the first circuit layer;
 a second unit disposed at the first elevation and having a second circuit layer and a second dielectric layer surrounding the second circuit layer;
 a first insulation wall disposed between the first unit and the second unit;
 a first redistribution layer disposed on the first unit and the second unit, and electrically connected between the first unit and the second unit; and a third unit disposed on the first redistribution layer and having a third circuit layer and a third dielectric layer surrounding the third circuit layer.

2. The wiring structure of claim 1, wherein the first redistribution layer is electrically connected to the third unit.

3. The wiring structure of claim 1, wherein the first insulation wall comprising material substantially different from the first dielectric layer.

4. The wiring structure of claim 1, wherein the first insulation wall is in direct contact with the first unit.

5. The wiring structure of claim 1, wherein the first redistribution layer is disposed on the first insulation wall.

6. The wiring structure of claim 1, further comprising a fourth unit disposed on the first redistribution layer and having a fourth circuit layer and a fourth dielectric layer surrounding the fourth circuit layer.

7. The wiring structure of claim 6, further comprising a second insulation wall disposed between the third unit and the fourth unit.

8. The wiring structure of claim 7, wherein the second insulation wall is in direct contact with the third unit.

9. The wiring structure of claim 6, further comprising a second redistribution layer disposed on the third unit and the fourth unit, and electrically connected between the third unit and the fourth unit.

10. The wiring structure of claim 7, further comprising a second redistribution layer disposed on the second insulation wall.

11. The wiring structure of claim 1, wherein the first insulation wall comprising particles.

12. The wiring structure of claim 1, wherein the first insulation wall surrounds the first unit.

13. The wiring structure of claim 1, wherein the first circuit layer has a pitch substantially same to the third circuit layer.

14. The wiring structure of claim 1, wherein the first circuit layer has a pitch substantially same to the first redistribution layer.

15. The wiring structure of claim 6, wherein the third unit and the fourth unit are disposed at a second elevation.

16. The wiring structure of claim 7, wherein the first insulation wall includes material substantially same to the second insulation wall.

17. The wiring structure of claim 7, wherein the first insulation wall includes material substantially different from the second insulation wall.

18. The wiring structure of claim 9, further comprising a third redistribution layer disposed on the second redistribution layer.

19. The wiring structure of claim 18, wherein the third redistribution layer has a pitch substantially different from the second redistribution layer.

20. The wiring structure of claim 18, further comprising an intermediate layer disposed between the second redistribution layer and the third redistribution layer.

* * * * *